United States Patent
Oh et al.

(10) Patent No.: US 6,441,412 B2
(45) Date of Patent: Aug. 27, 2002

(54) UNIT PIXEL OF CMOS IMAGE SENSOR WITH CAPACITOR COUPLED PHOTODIODE

(75) Inventors: Hoon-Sang Oh; Jin-Su Han, both of Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 09/742,168

(22) Filed: Dec. 19, 2000

(30) Foreign Application Priority Data

Dec. 28, 1999 (KR) .............................. 99-63845

(51) Int. Cl.[7] ................... H01L 31/062; H01L 31/113
(52) U.S. Cl. .................... 257/292; 257/291; 257/296; 257/369
(58) Field of Search .................... 257/290, 291, 257/292, 296, 311, 369, 395, 396

(56) References Cited

U.S. PATENT DOCUMENTS 5,949,061 A * 9/1999 Guidash et al. .......... 250/208.1
6,100,551 A * 8/2000 Lee et al. ................... 257/232

* cited by examiner

*Primary Examiner*—Ngân V. Ngô
(74) *Attorney, Agent, or Firm*—Townsend & Townsend and Crew LLP

(57) ABSTRACT

A unit pixel in a CMOS image sensor, which enhances a capacitance of a photodiode to reduce noises and increase the maximum output signal of the image sensor, is provided. To achieve this, the CMOS image sensor includes a photodiode aligned with an edge of an insulating film for separating elements and formed by doping impurities to a semiconductor layer by an ion implantation; and a capacitor formed along with interface between the photodiode and the insulating film on plan and formed by layering a bottom electrode, a dielectric and an upper electrode contacted with the photodiode.

10 Claims, 4 Drawing Sheets

UNIT PIXEL OF CMOS IMAGE SENSOR WITH CAPACITOR COUPLED PHOTODIODE

FIELD OF THE INVENTION

The present invention relates to a CMOS image sensor; and, more particularly, to a unit pixel in a CMOS image sensor with a capacitor coupled photodiode to enhance its capacitance.

DESCRIPTION OF THE PRIOR ART

A complementary metal oxide semiconductor(CMOS) image sensor is a device that converts an optical image to an electrical signal using a CMOS manufacturing technology, which employs a switching scheme of MOS transistor for transportation of photo-electric charge from photodiode to output node as well as detection of output signal at the output node. In contrast with a charge coupled device (CCD) image sensor currently available in the marketplace, the CMOS image sensor has the following merits; its driving scheme is simplified and various scanning schemes may be implemented; it allows a signal processing circuit to be integrated on a single chip thereby minimize products; it employs therein an interchangeable CMOS technology to be able to lower production costs and low power consumptions.

Referring to FIG. 1, there is shown a connection diagram of a unit pixel in a conventional CMOS image sensor, which has been proposed by the applicant. In FIG. 1, a unit pixel in CMOS image sensor includes one photodiode (PD) and four NMOS transistors. The four transistors include a transfer transistor (TX) for transferring photo electric charges generated from the photodiode to a floating sensing node, a reset transistor (RX) for discharging the charges stored in the floating sensing node to detect subsequent signals, a drive transistor (DX) acting as a source follower, and a select transistor (SX) acting as a switching to an addressing.

The transfer transistor (TX) and the reset transistor (RX) are made of an native NMOS transistor having extremely low threshold voltage nearly equal to zero volt to prevent the degradation of charge transfer efficiency, which may be incurred by the loss of electric charges associated with the voltage drop resulting from the positive threshold voltage of the transistor. Provided between an output OUT of the unit pixel and a ground GND is a load transistor VB for biasing. The photodiode PD and a substrate of the floating sensing node are grounded. In FIG. "CF" represents a capacitance of the floating sensing node and "CP" represents a capacitance of a pinned photodiode.

Referring to FIG. 2, there is shown a sectional view of a unit pixel in the conventional CMOS image sensor, which has been proposed by the applicant. In FIG. 2, a p+-silicon substrate, a p-epitaxial layer, a p-well, a field oxide film, a gate oxide film, a gate electrode, an N-diffusion region, P° diffusion region, N+-floating diffusion region and an oxide spacer film are depicted by reference numerals 1 to 10, respectively. Referring to FIG. 2, the photodiode PD includes a PNP junction structure, which is formed by the sequential ion implantation of N-type and P-type dopants, or vice versa, into the P-epitaxial layer 2, the N−-diffusion region 7 and the P° diffusion region 8, wherein the capacitance CP of the photodiode PD is formed by the N−-diffusion region 7 and the capacitance CF of the floating sensing node is formed by the floating diffusion region FD, i.e., a portion at which one end of the transfer transistor (TX) and one end of the reset transistor (RX) are commonly coupled.

The unit pixel in the image sensor fabricated thus is operated as follows. First, the reset transistor (RX), the transfer transistor (TX) and the select transistor (SX) are turned on to reset the unit pixel. As such, the N−-diffusion region 7 gradually begins to be depleted and is completely depleted. In this situation, the capacitance CP entails a carrier charging up to a pinning voltage on the completed depletion, and the capacitance CF of the floating sensing node entails a carrier charging up to a supply voltage VDD. Thereafter, the transfer transistor (TX) is turned off, the select transistor (SX) is turned on and then the reset transistor (RX) is turned off. In this situation, an output voltage V1 is generated from the output terminal OUT and stored in a buffer (not shown). Next, the transfer transistor (TX) is turned on to move carriers in the capacitance CP which has been changed according to a light intensity, to the capacitance CF. After that, an output voltage V2 is generated from the terminal OUT and an analog data for V1-V2 is converted to a digital data. Thus, one operation period for the unit pixel is terminated.

As mentioned above, each unit pixel constituting the CMOS image sensor includes the photodiode in which electrons are generated by light incident externally and stored therein, and a circuit for receiving the electrons stored in the photodiode and converting the same to electrical output signals (voltages or currents). In this case, since a maximum output signal is directly proportional to the number of electrons to be extracted from the photodiode, the maximum output signal increases with increased electron acceptability, i.e., an increased capacitance, of the photodiode. In general, a silicon based photodiode is fabricated using a PN junction, and a duplex structure such as PNP or NPN junctions, wherein the electrons containing performance (electron capacity) of these junctions depend on the doping level of silicon substrate itself and the concentration profile of the dopants implanted into the substrate to form the junction. In case the photodiode does not have sufficient capacitance, a certain portion of the photo-electrons which cannot be stored in the photodiode may leak out toward the substrate thereby decrease the maximum output signal and entails an additional problem such as noise generation by the leaked electrons.

Therefore, a sufficient capacitance of the photodiode is of importance. Unfortunately, however, since the capacitance of the photodiode strongly depends on the doping profile of the photodiode which is determined by the implantation conditions of N-type and P-type dopants, it is very difficult to adjust the capacitance of the photodiode at its option.

FIG. 3A is a top view of the conventional unit pixel, which depicts a substantial size of the photodiode and its status, wherein only the photodiode and a gate of the transfer transistor (TX) and the floating sensing node (FD) are schematically shown. FIG. 3B is a sectional view of the conventional unit pixel as taken along the line A-A' of FIG. 3A.

SUMMARY OF THE INVENTION

It is, therefore, a primary object of the present invention to provide a unit pixel in a CMOS image sensor, which is capable of enhancing the capacitance of photodiode to reduce noises and increasing the maximum output signal of the image sensor.

In accordance with a preferred embodiment of the present invention, there is provided a CMOS image sensor, comprising: a photodiode aligned with an edge of an insulating film for separating elements and formed by doping impurities into a semiconductor layer by an ion implantation; and a capacitor formed along with interface between the photodiode and the insulating film on plan and formed by layering a bottom electrode, a dielectric and an upper electrode contacted with the photodiode.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
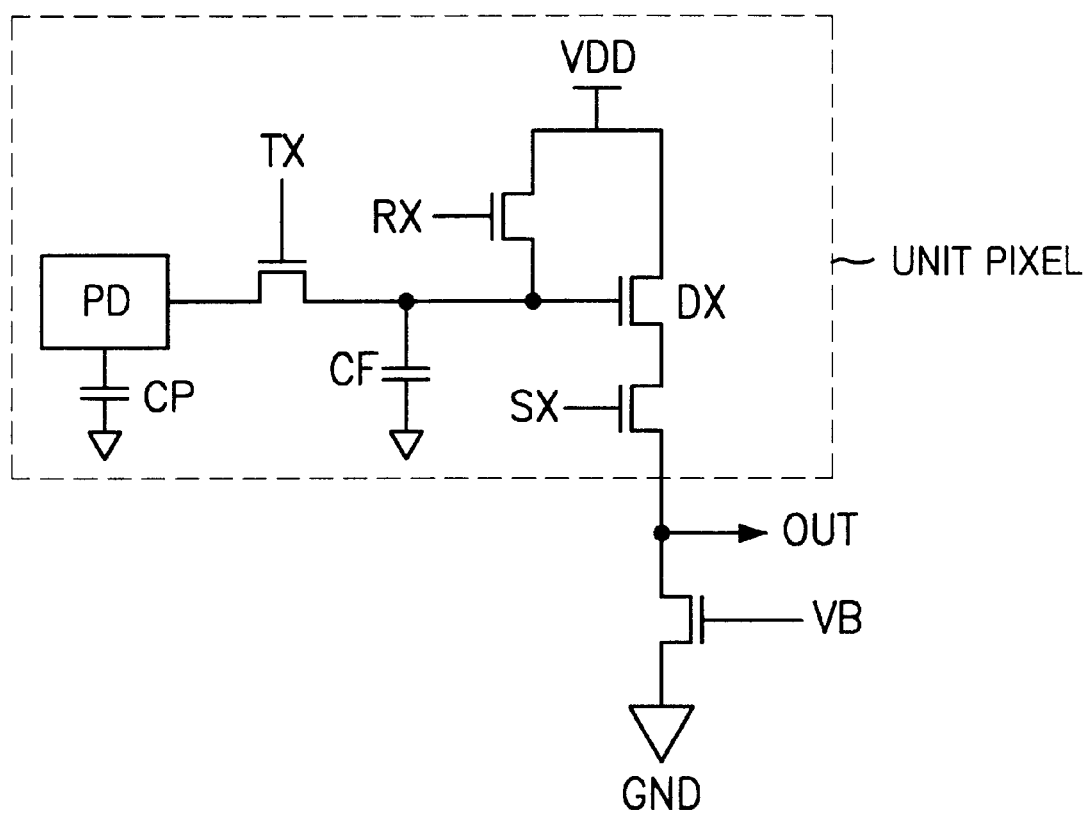
FIG. 1 shows a connection diagram of a unit pixel in a conventional CMOS image sensor.
Figure 2:
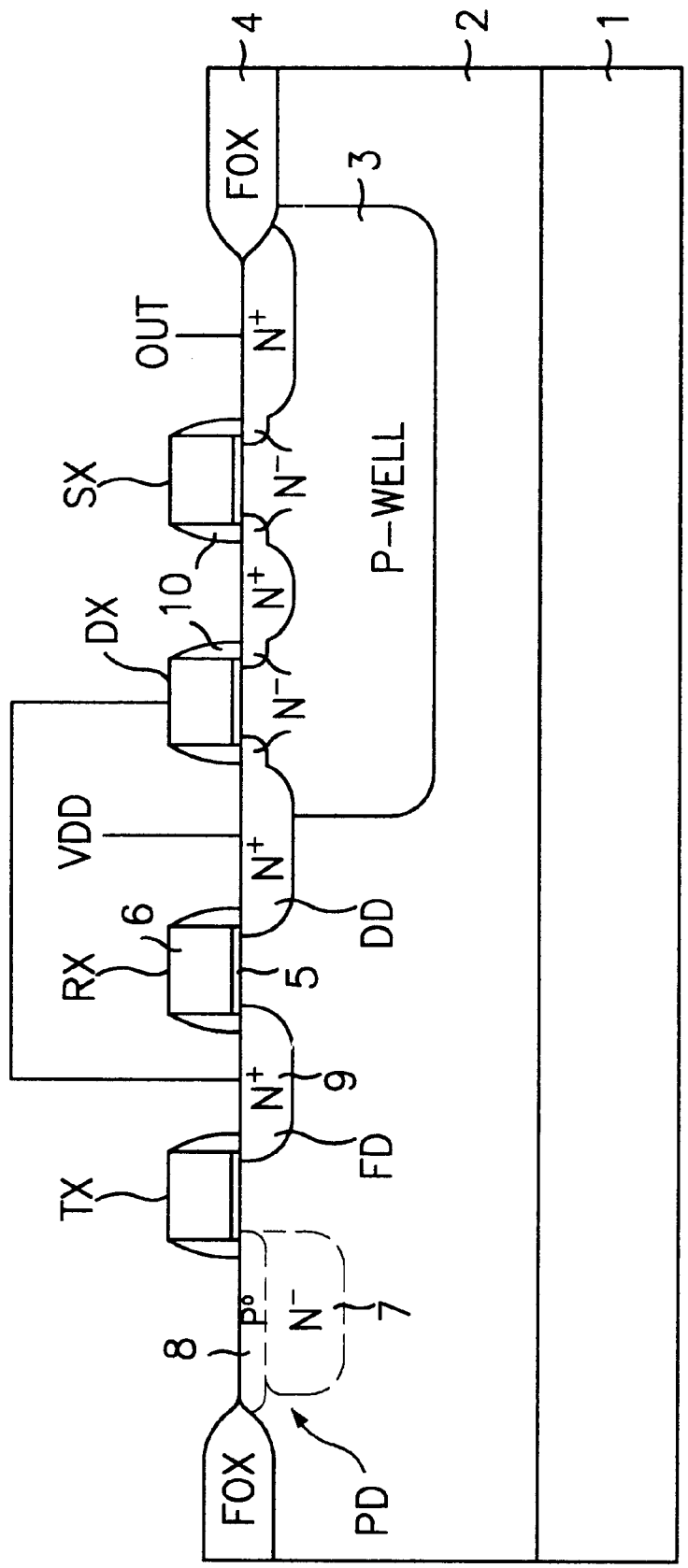
FIG. 2 is a sectional view of a unit pixel in the conventional CMOS image sensor.
Figure 3A:
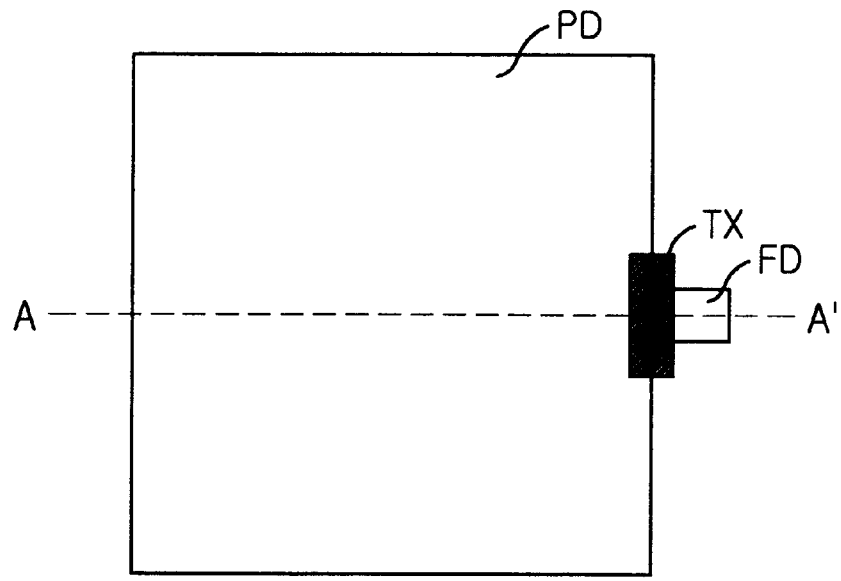
FIGS. 3A and 3B are a top view and a sectional view of the conventional unit pixel which depicts a substantial size of the photodiode and its status.
Figure 3B:
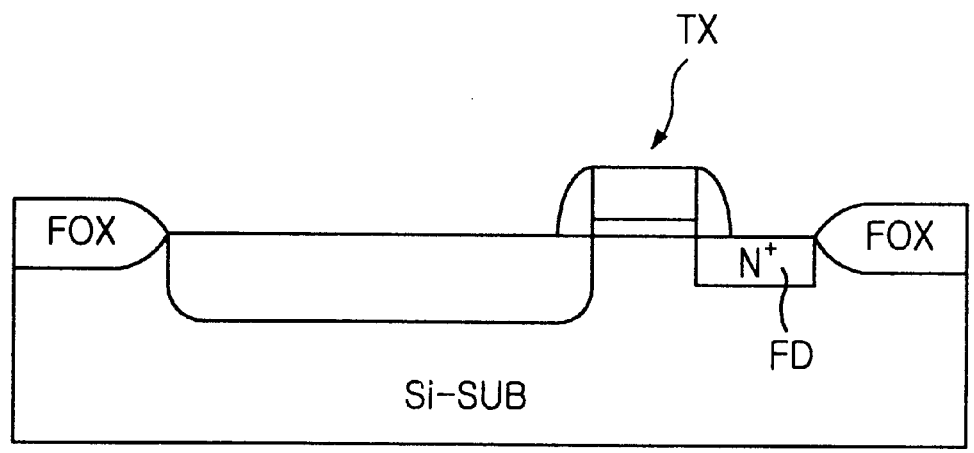
Figure 4A:
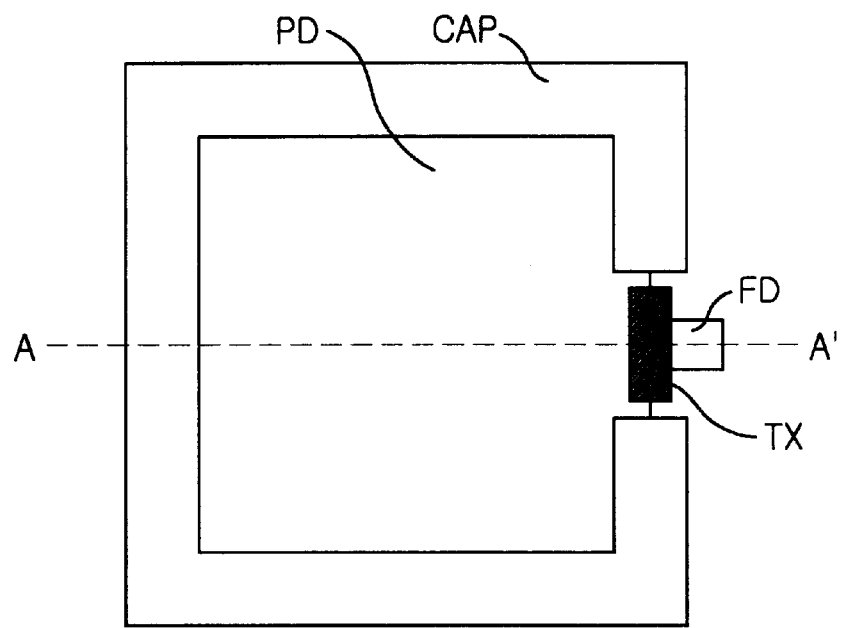
FIGS. 4A and 4B are a top view and a cross sectional view of a unit pixel in a CMOS image sensor in accordance with a preferred embodiment of the present invention.
Figure 4B:
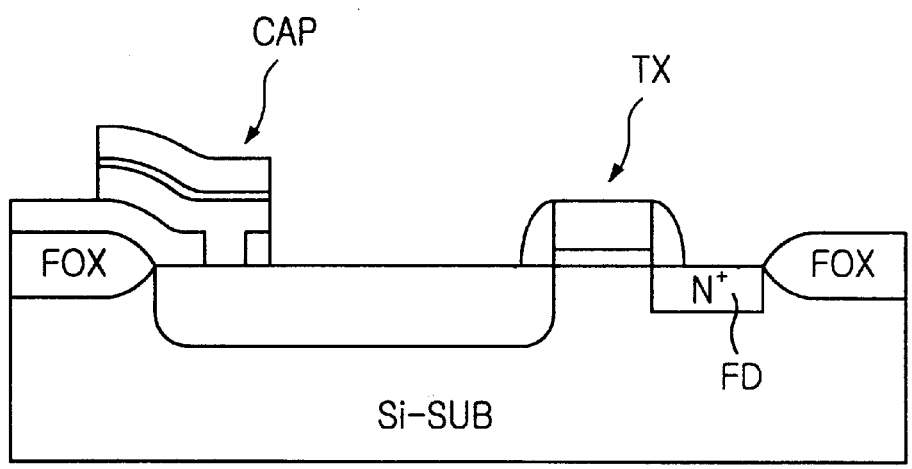

FIGS. 4A and 4B are a top view and a cross sectional view of a unit pixel in a CMOS image sensor in accordance with a preferred embodiment of the present invention.

As is apparent from FIGS. 4A and 4B, in the unit pixel in the image sensor of the present invention, a capacitor Cap is coupled with a photodiode.

Specifically, a silicon substrate is provided with a insulating film for separating elements (FOX) for defining an active region and a photodiode with aligned to an edge of the insulating film (FOX) and an edge of one side in gate of a transfer transistor (TX).

A floating diffusion region (FD) is formed on the substrate at the other side of the gate of the transfer transistor (TX).

Doping impurities to a semiconductor layer by an ion implantation forms the photodiode, which may be a PN photodiode, a PNP or NPN photodiode.

The capacitor Cap is formed by layering a bottom electrode, a dielectric and an upper electrode in this order along with boundary of the insulating film and the photodiode on plan, to thereby increase the surface area of the capacitor to insure a capacitance thereof at maximum.

The bottom electrode of the capacitor is contacted with the photodiode with an intervened insulating film. The bottom and upper electrodes are made of doped polysilicons. A silicon oxide film may be used as the dielectric, or an insulating film with oxide/nitride/oxide (ONO) structure or a material with a high dielectric constant such as $Ta_2O_5$ may be used as the dielectric to increase the capacitance still more.

In the following, the operation of such structure will be described in brief.

In case the photodiode generates electrons by light incident externally, the application of a positive voltage to the upper electrode of the capacitor allows the electrons to be contained in the capacitor. In other words, in contrast with the case without an additional capacitor, the present invention allows the photodiode to contain additional electrons equal to the capacitance of additional capacitor. After the electrons have been completely stored in the capacitor, if the electrons begin to be discharged therefrom, the present invention removes the bias applied to the upper electrode to allow the electrons to be extracted by an external circuit.

As previously mentioned, in contrast with the prior art photodiode, the present invention can enhance the electron containing performance (electron capacity) of the photodiode, to thereby allow the photodiode to charge a substantial amount of electrons therein, which, in turn, enlarges an output voltage range of the image sensor resulting in an improved resolution thereof.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A complementary metal oxide semiconductor (CMOS) image sensor, comprising:

a photodiode formed in a semiconductor layer; and a capacitor having a bottom electrode contacting the photodiode, a dielectric layer formed on the bottom electrode and an upper electrode formed on the dielectric layer.

2. The CMOS image sensor recited in claim 1, wherein the photodiode is aligned with an edge of an insulating film for isolating elements.

3. The CMOS image sensor as recited in claim 1, wherein the bottom and upper electrodes include a doped polysilicon, respectively.

4. The CMOS image sensor as recited in claim 1, wherein the dielectric includes one of an oxide, an oxide/nitride/oxide (ONO) film and $Ta_2O_5$.

5. The CMOS image sensor as recited in claim 1, wherein the photodiode includes one of a PN junction, a PNP and NPN junctions.

6. A complementary metal oxide semiconductor (CMOS) image sensor, comprising:

a semiconductor layer with an insulting film for isolating elements;

a transistor including a gate electrode on the semiconductor layer;

a photodiode formed in the semiconductor layer and aligned along an edge of the insulting film and to one side of the gate electrode; and a capacitor having a bottom electrode contacting the photodiode, a dielectric layer on the bottom electrode and an upper electrode formed on the dielectric layer.

7. The CMOS image sensor as recited in claim 6, wherein the bottom and upper electrodes include a doped polysilicon, respectively.

8. The CMOS image sensor as recited in claim 6, wherein the dielectric includes one of an oxide, an oxide/nitride/oxide (ONO) film and $Ta_2O_5$.

9. The CMOS image sensor as recited in claim 6 wherein the photodiode includes one of a PN junction, a PNP and NPN junctions.

10. The CMOS image sensor as recited in claim 6 wherein the capacitor substantially surrounds the photo diode.

* * * * *

UNITED STATES PATENT AND TRADEMARK OFFICE
CERTIFICATE OF CORRECTION

PATENT NO.    : 6,441,412 B2
DATED         : August 27, 2002
INVENTOR(S)   : Oh et al.

It is certified that error appears in the above-identified patent and that said Letters Patent is hereby corrected as shown below:

Column 4,
Line 41, replace "insulting" with -- insulating --.
Line 43, after "electrode" insert -- formed --.
Line 46, replace "insulting" with -- insulating --.
Line 50, after "layer" insert -- formed --.

Signed and Sealed this

Third Day of June, 2003

JAMES E. ROGAN
*Director of the United States Patent and Trademark Office*